United States Patent
Westra

4,128,808
Dec. 5, 1978

[54] CHANNEL FREQUENCY ANALYSER

[75] Inventor: Marlin D. Westra, Sioux Falls, S. Dak.

[73] Assignee: Sencore, Inc., Sioux Falls, S. Dak.

[21] Appl. No.: 738,647

[22] Filed: Nov. 4, 1976

[51] Int. Cl.² ............................................. H03C 3/00
[52] U.S. Cl. .................................... 325/134; 325/67; 325/31; 324/79 D; 332/20
[58] Field of Search ...................... 325/134, 133, 2, 31, 325/67, 363, 25, 176, 455; 324/77 B, 77 C, 77 CS, 78 R, 78 E, 78 D, 78 Z, 79 R, 79 D; 332/20; 340/248 P

[56] References Cited

U.S. PATENT DOCUMENTS

| | | | |
|---|---|---|---|
| 2,705,281 | 3/1955 | Morris et al. | 325/134 |
| 3,487,313 | 12/1969 | Cushman et al. | 324/78 D |
| 3,537,002 | 10/1970 | Haner et al. | 324/79 D |
| 3,549,997 | 12/1970 | Rotzel | 324/79 D |
| 3,571,760 | 3/1971 | Schwartz | 325/134 |
| 3,808,407 | 4/1974 | Flatz | 324/79 D |
| 3,812,427 | 5/1974 | Coulter | 324/79 D |

FOREIGN PATENT DOCUMENTS 929228   6/1973   Canada ................................. 324/78 Z

OTHER PUBLICATIONS

Measure Pulse-Rate Ratios, Electronic Design 24, Nov. 22, 1976, pp. 140-142.

*Primary Examiner*—Robert L. Griffin
*Assistant Examiner*—Tommy P. Chin
*Attorney, Agent, or Firm*—Edmond T. Patnaude

[57] ABSTRACT

The percentage deviation of citizen band transmitter channel frequencies from the standard channel frequencies is determined by counting the difference between the number of cycles in the transmitted and standard frequencies during a period of 0.37 second, the number counted being mathematically related to the percentage deviation by the same factor for all channel frequencies.

7 Claims, 5 Drawing Figures

CHANNEL FREQUENCY ANALYSER

The present invention relates in general to a method and apparatus for monitoring the frequencies of a plurality of signals, and it relates in particular to a new and improved method and apparatus for visually indicating the percentage deviation of each of a plurality of channel or carrier frequencies from a plurality of respective standard frequencies.

The present invention is particularly suited for use in servicing and monitoring citizens band transmitters, and therefore, is described in connection therewith. However, the invention is not so limited and may be used wherever such method and apparatus are applicable to frequency monitoring.

BACKGROUND OF THE INVENTION

The Federal Communications Commission requires that citizen band transmitters transmit channel frequencies within 0.005% of the standard channel frequencies. The standard channel frequencies for the present twenty-three citizen band channels are between 26.965 MHZ (channel 1) and 27.255 MHZ (channel 23). When using the prior art frequency monitoring equipment to ascertain whether the transmitted signals were within the percentage deviation permitted by the Federal Communication Commission, it was necessary for the service technician to memorize or look up in a table each standard channel frequency, then measure each channel frequency of the transmitter, and then calculate the actual percentage deviations to ascertain if each transmitter channel frequency was within the 0.005% limits.

SUMMARY OF THE INVENTION

Briefly, there is provided in accordance with the teachings of the present invention a new and improved method and apparatus for directly measuring the percentage deviation between each of the transmitter channel frequencies and each of the standard channel frequencies. No memorizing or calculating is required of the service technician wherefor the transmitter channel frequencies may be checked more quickly and accurately. The method of this invention comprises the steps of counting the difference in cycles between each channel frequency and the associated standard frequency over a period of predetermined duration such that said differences are related to the percentage deviations by substantially the same factor for all of the channel frequencies to be monitored. The apparatus of this invention comprises an electronic circuit for automatically carrying out the steps of this novel method and for displaying the percentage deviation for each transmitter channel frequency.

BRIEF DESCRIPTION OF THE DRAWING

Further objects and advantages and a better understanding of the present invention can be had by reference to the following detailed description, wherein.

DETAILED DESCRIPTION OF THE INVENTION

Figure 1:
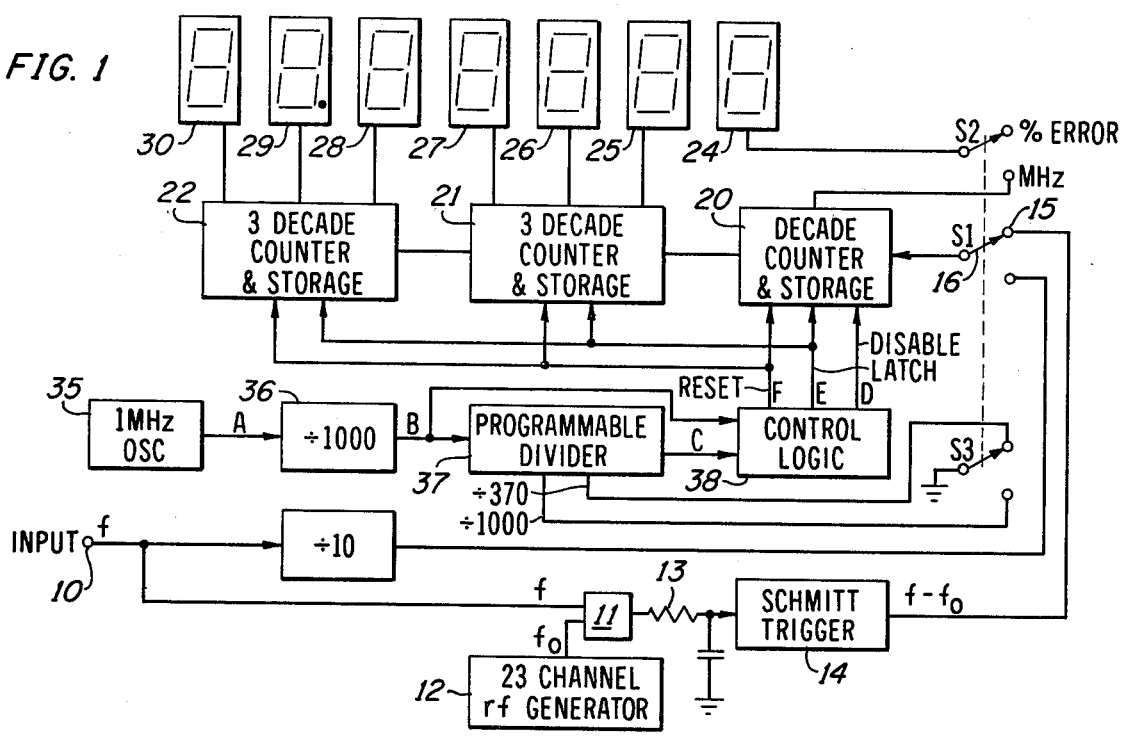
FIG. 1 is a schematic diagram of a citizen band channel frequency analyzer embodying the present invention.

Referring particularly to FIG. 1 the channel frequency output from the transmitter under test is adapted to be coupled to a signal input jack 10 which is connected to one input of a mixer 11. The output of a standard channel frequency generator 12 provides each of the 23 standard channel frequencies and includes a manual control (not shown) enabling the service technician to select the particular standard frequency corresponding to the transmitter channel frequency applied to the input jack 10.

For each pair of transmitter channel and standard channel frequencies thus applied to the inputs of the mixer 11, the output from the mixer 11 is a plurality of different, discrete frequency components including inter alia a frequency component equal to the difference between the two frequencies which are denoted herein as measured frequencies f and the standard channel frequencies fo. Therefore, for any one channel being checked the output of the mixer includes a frequency component at the frequency f-fo. This difference output frequency component is separated from the other output frequency signals by a suitable RC filter 13 and applied to the input of a trigger circuit 14 which produces a dc pulse upon each positive excursion of the input signal thereto. Accordingly, the output signal from the trigger circuit 14 is a train of dc pulses occurring at the rate or frequency of f-fo.

The output of the trigger circuit 14 is coupled to a contact 15 of a switch S1 whose wiper arm 16 is ganged to the wiper arms of two additional switches S2 and S3. The circuit illustrated in FIG. 1 may be used for automatically displaying the percentage frequency deviation of the applied channel frequency by positioning the wiper arms of the switches S1, S2 and S3 in the illustrated upper positions. It may also be used for indicating the actual transmitter channel frequency applied to the input terminal by positioning the wiper arms of the switches S1, S2 and S3 in the lower positions. With the wiper 16 in the illustrated position, the train of pulses from the trigger circuit 14 is coupled to the decade counter and storage stage 20 and thence to two additional decade counter and storage stages 21 and 22. A plurality of numerical display devices 24–30 are connected as shown to the counters 20–22 with the display device 24 being disconnected from the single decade counter 20 via the switch S2 when the switches S1, S2 and S3 are in the channel frequency deviation check operating mode as shown.

As more fully explained hereinafter, when the wipers of the switches S1, S2 and S3 are in the illustrated positions the counters 20–33 are controlled so as to display the number of pulses counted during a period of 0.37 second. As a result, the percentage deviation of the applied transmitter channel frequency from the associated standard channel frequency is displayed by the devices 25–30. As explained above, when the wipers of the switches S1, S2 and S3 are in the lower switching positions, the actual transmitter channel frequency applied to input terminal 10 is displayed by the devices 24–30.

In order to understand the theory of operation of this novel method and circuit, consider the following equation which expresses the percentage deviation in terms of the transmitter channel and standard channel frequencies.

$$\% \text{ Deviation} = \frac{f - fo}{fo} \times 100$$

Since, however, fo is always close to 27 MHZ for the twenty-three citizen band channel frequencies, the above equation may be approximated to:

$$\% \text{ Deviation} \simeq \frac{f - fo}{2.7 \times 10^5}$$

$$\% \text{ Deviation} \simeq .37(f - fo) \times 10^{-5} \frac{\text{cycles}}{\text{counted period}}$$

In the circuit of FIG. 1 the factor $10^{-5}$ is incorporated in the decimal place on the display between the devices 28 and 29 and the factor 0.37 is incorporated as the time base during which the count is made.

It may be seen that this approximation provides a reading which is in error by less than one percent in the worst case, i.e., a reading for channel 23 whose channel frequency of 27.255 is farthest from the percentage base of 27. As an example, if the actual frequency for the transmitter frequency for channel 23 is 27.256, the actual percentage deviation will be 0.00367%. The displayed deviation would be 0.00370. Since, however, the last digit is not displayed since display device 24 is disconnected by the switch S2, the readout is 0.0037.

Figure 2:
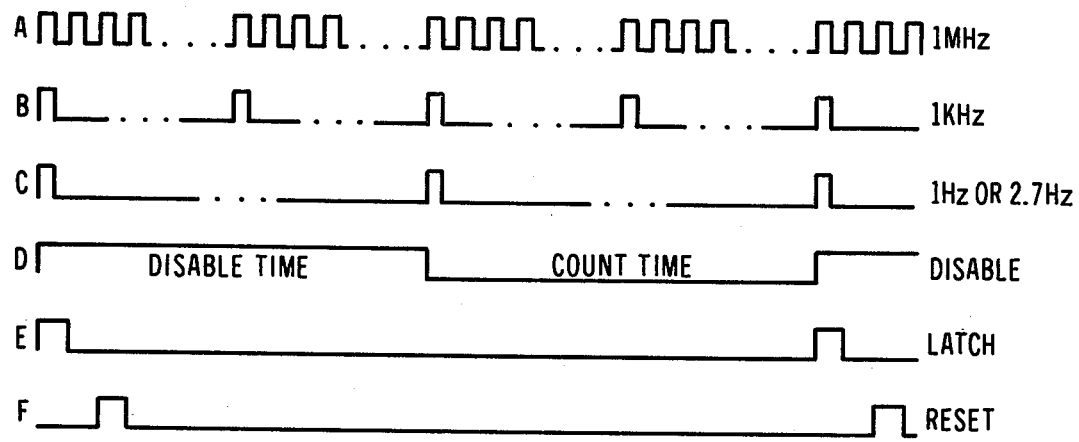
FIGS. 2A through 2F illustrate a number of different wave forms useful in understanding the operation of the circuit of FIG. 1.

In order to set the time base at 0.37 second, the output from the 1 MHZ crystal controlled oscillator 35, is divided by 1000 in a divider 36 and then divided by 370 in a programmable divider 37 to provide a train of pulses at the rate of 2.7 Hz. The wave forms of the respective outputs from the oscillator 35, the divider 36 and the divider 37 are shown in FIGS. 2A, 2B and 2C.

The train of pulses from the divider 37, wave form C, is applied to the input of a control logic module 38 which produces a latching pulse (FIG. 2E) in response to every other input pulse applied thereto. Upon the occurrence of each latch-pulse the number last counted by the counters is displayed until the occurrence of the next latch pulse.

The control logic module 38 also produces a positive disable voltage in response to every other input pulse from the divider 37. The disable voltage is shown in wave form D and it will be noted that a disable period immediately follows each latch pulse. The disable voltage pulse is initiated on one input pulse and terminated on the following input pulse. Consequently, the counters are disabled and enabled for alternate periods of 0.37 second. The counters are reset by reset voltage pulses, wave form F, after the time displays are latched and during the time the counters are disabled.

Figure 3:
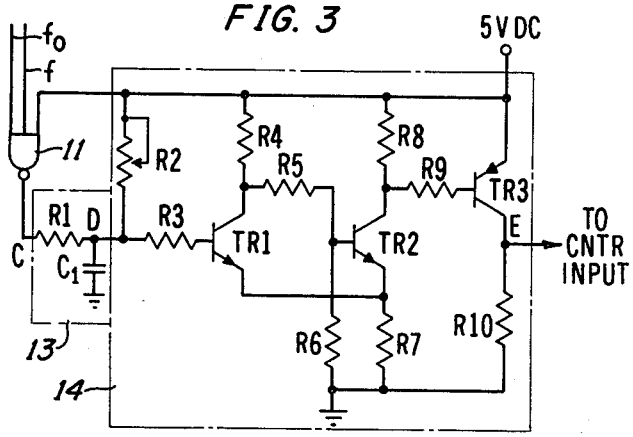
FIG. 3 is a schematic circuit diagram showing in greater detail that portion of the circuit of FIG. 1 which provides output pulses at the frequency difference between each applied transmitter channel frequency and each standard frequency.

Referring to FIG. 3 the circuit there shown illustrates the manner in which the train of pulses at the frequency f−fo is obtained. The mixer 11 is a NAND gate which responds to the coincidence of the two input signals at frequencies f and fo to provide a train of pulse width modulated pulses as shown in wave form C in FIG. 4.

Figure 4:
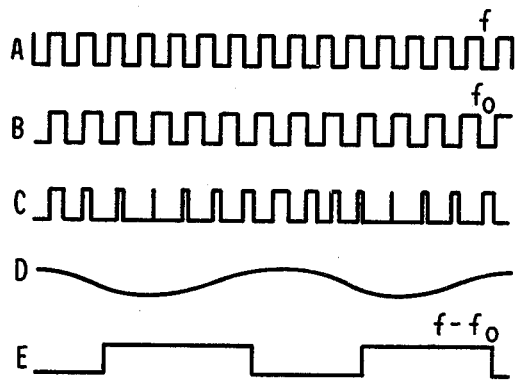
FIGS. 4A through 4E illustrate a number of different wave forms useful in understanding the operation of the circuit of FIG. 3.

Wave forms A and B in FIG. 4 are the respective inputs at frequencies f and fo.

The output of the NAND gate 11, wave form C, is filtered by the filter 13 comprising resistor R1 and capacitor C1 to produce wave form D as shown in FIG. 4. This wave form is coupled through a resistor R3 to the base of a transistor TR1 which is connected with a transistor TR2 in a conventional Schmitt trigger circuit. A variable resistor R2 is provided to enable adjustment of the trigger level. A level shifting amplifer including the transistor TR3 inverts the trigger output to provide the wave form E of FIG. 4. The polarity of this output signal (wave form E) is compatable with the counter inputs.

Figure 5:
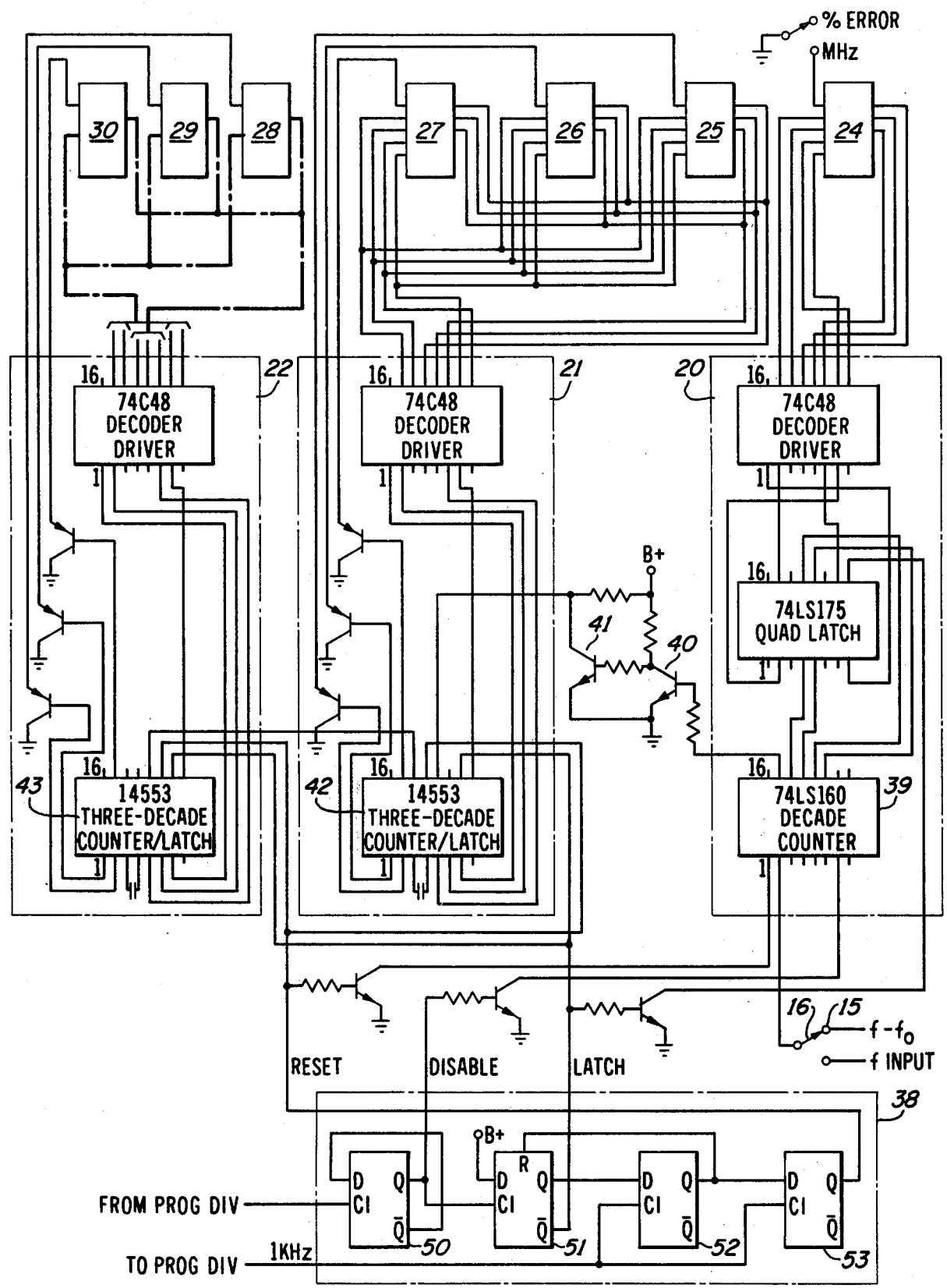
FIG. 5 is a schematic circuit diagram illustrating the control logic containing storage and display portion of the analyzer of the present invention.

Refer now to FIG. 5 wherein is schematically shown the control logic 38, the counter and storage circuits 20–22 and the displays 24–30. These circuits employ commonly available, standard solid state integrated circuit components to perform the functions heretofore described. These components are identified on the drawing by their commercial designations. It will be apparent to those skilled in the art that other circuit configuration can be made to carry out the teachings of the present invention. Although the operation of the circuit shown in FIG. 5 will be readily understood by those skilled in the art it may be helpful to note that for purposes of clarity the unused input pins and the power supply connections to the integrated circuits are not shown. Also, it should be noted that the overflow of the decade counter 39 is level shifted in the transistors 40 and 41 and fed into the clock input of the counter latch 42. The overflow of the counter latch 42 is in turn fed to the clock input of the next counter latch 43 to obtain seven decades of counting. Although the disable voltage (FIG. 2D) is applied only to the first counter stage 39 it nevertheless disables all of the counter stages because of the overflow connections.

The counter and storage circuit 22 is connected to the display devices 28, 29 and 30 in the same manner the counter and storage circuit 21 is connected to the display devices 25, 26 and 27.

The control logic circuit 38 may be seen to employ four series connected flip-flop stages, each flip-flop being one-half of a 4013. The first flip-flop is identified by the reference character 50 and is connected as a simple divide by two stage to provide the disable signal at its Q output. When this disable signal (FIG. 2D) goes through a positive transition it clocks the second flip-flop stage 51 to produce the latch pulse on its output Q. Upon the occurrence of the first 1 KHz pulse (FIG. 2B) the third stage flip-flop 52 is clocked to produce a high voltage on its output Q to reset the second stage flip-flop 51 so that its Q output is low. Consequently, the next 1 KHz pulse changes the Q output of flip-flop 52 to a low state and the Q output of the fourth flip-flop 53 to the high state. A third 1 KHz pulse returns the fourth Q output to the low state.

While the present invention has been described in connection with particular embodiments thereof, it will be understood by those skilled in the art that many changes and modifications may be made without departing from the true spirit and scope of the present invention. Therefore, it is intended by the appended claims to cover all such changes and modifications which come within the true spirit and scope of this invention.

What is claimed is:

1. A method of measuring the percentage deviations of any one of a plurality of first frequencies from a plurality of respective reference frequencies, comprising the steps of counting during a period of predetermined duration the difference between the number of cycles of one of said first frequencies and the number of cycles of the corresponding one of said reference frequencies, the duration of said period being selected such that said difference is mathematically related to each of said percentage deviations by substantially the same factor for all of said first frequencies and the corresponding ones of said reference frequencies.

2. A method according to claim 1 wherein said period is inversely proportional to a frequency within the range of said first frequencies.

3. A method according to claim 2 wherein said range is between 26.965 MHZ and 27.255 MHZ.

4. Apparatus for measuring percentage deviations of a plurality of first frequencies from a plurality of respective reference frequencies, comprising a source of said reference frequencies, means for providing a train of pulses at the differential frequency between each of said first frequencies and said associated reference frequencies, and means for counting said pulses throughout a period having a duration such that the number of pulses counted is related to said percentage deviation by substantially the same factor for all of said first frequencies.

5. Apparatus according to claim 4 comprising display means for providing a visual display of the number of pulses counted during said period.

6. Apparatus according to claim 4 for use in monitoring a citizen band transmitter, comprising means for setting said period to be equal to 0.37 seconds.

7. Apparatus according to claim 6 wherein said means for providing a train of pulses comprises a mixer and a filter connected to the output of said mixer.

* * * * *